United States Patent
Martinez et al.

(10) Patent No.: US 6,275,083 B1
(45) Date of Patent: Aug. 14, 2001

(54) LOW OPERATIONAL POWER, LOW LEAKAGE POWER D-TYPE FLIP-FLOP

(75) Inventors: Mario Martinez, Stanford; Vamsi Srikantam, Sunnyvale, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/655,206

(22) Filed: Sep. 5, 2000

(51) Int. Cl.$^7$ ........................................................ H03K 3/12
(52) U.S. Cl. ............................ 327/218; 327/202; 327/203
(58) Field of Search ..................................... 327/199, 200, 327/201, 202, 203, 208, 209, 210, 211, 212, 213, 214, 197, 218; 326/93, 94, 95, 96, 97

(56) References Cited

U.S. PATENT DOCUMENTS

| | | | |
|---|---|---|---|
| 4,112,296 | * 9/1978 | Heimbigner | 327/212 |
| 5,789,956 | 8/1998 | Mahant-Shetti et al. | 327/202 |
| 5,831,463 | * 11/1998 | Sachdev | 327/202 |
| 5,990,717 | * 11/1999 | Partovi et al. | 327/210 |
| 6,060,927 | 5/2000 | Lee | 327/218 |

OTHER PUBLICATIONS

Halter, Jonathan and Najm, Farid, "A Gate–Level Leakage Power Reduction Method for Ultra–Low–Power CMOS Circuits", IEEE 1997 Custom Integrated Circuits Conference, pp. 475–478.

Hsu, Steven and Lu, Shih–Lien, "A Novel High–Performance Low–Power CMOS Maser–Slave Flip–Flop" IEEE Intl. ASIC Conf., Sep. 1999, pp. 340–343.

Wang, Jin–Shyan et al. "Design of a 3–V 300–MHZ Low–Power 8–b x8–b Pipelined Multiplier Using Pulse–Triggered TSPC Flip–Flops", IEEE Journal of Solid–State Circuits, vol. 35, No. 4, Apr. 2000, pp. 583–592.

Stojanovic, Vladimir and Oklobdzija, Vojin; "Comparative Analysis of Maser–Slave Latches and Flip–Flops for High–Performance and Low–Power Systems", IEE E Journal of Solid–State Circuits, vol. 34, No. 4, Apr. 1999, pp. 536–548.

Ko, Uming and Balsara, Poras; "High–Performace Energy–Efficient D–Flip–Flop Circuits", IEEE Transactions on Very Large Scale Integration (VLSI) Systems, vol. 8, No. 1, Feb. 2000, pp. 94–98.

Chen, Zhanping Chen et al. "Estimation of Standby Leakage Power in CMOS Circuits Considering Accurate Modeling of Transistor Stackes", Proc. IEEE & ACM Intl. Symp. on Low Power ELectronics & Design, Aug. 1998, pp. 239–244.

* cited by examiner

*Primary Examiner*—Kenneth B. Wells
*Assistant Examiner*—Paul Dinh
(74) *Attorney, Agent, or Firm*—Ian Hardcastle (57) ABSTRACT

A flip-flop having a sleep mode in which power consumption is reduced. The flip-flop comprises a clock input, a data input, an input stage, an input gate, an output stage and an output clamp. The input gate is interposed between the data input and the input stage and operates in the sleep mode to isolate the input stage from the data input. The output stage is coupled to the input stage and includes an output having a first output state and a second output state. The output clamp operates in the sleep mode to set the output stage to a predetermined state regardless of the data states at the data input and the clock input. The predetermined state is the one of the output states in which the leakage power consumption of the flip-flop is less than in the other of the output states. The predetermined state may alternatively be the one of the output states in which the leakage power consumption of circuitry connected to the output of the flip-flop is less than in the other of the output states. As a further alternative, the predetermined state may be the one of the output states in which the leakage power consumption of a digital electronic circuit of which the flip-flop forms part is less than in the other of the output states.

20 Claims, 4 Drawing Sheets

LOW OPERATIONAL POWER, LOW LEAKAGE POWER D-TYPE FLIP-FLOP

FIELD OF THE INVENTION

The invention relates to digital electronic circuits and, in particular, to a flip-flop that has low operational power consumption and low leakage power consumption and that additionally has a sleep mode. In the sleep mode, the output of the flip-flop is held in a state that sets a digital electronic circuit that includes the flip-flop to a low leakage power consumption state.

BACKGROUND OF THE INVENTION

Flip-Flops are the basic storage elements used in synchronous digital VLSI circuits and in other digital electronic circuits. Existing flip-flop designs include the following:

1. Sense-Amp Flip-Flop
2. StrongArm™ 110 Flip-Flop
3. Modified C²MOS Flip-Flop
4. Semi Dynamic (SD) Flip-Flop
5. Hybrid Latch (HL) Flip-Flop
6. Pulse Triggered True single-phase clocking Flip-Flop (PTTFF)
7. DSTC Master-Slave Latch
8. 8 transistor D Flip-Flop
9. 9 transistor D Flip-Flop
10. High Speed D Flip-Flop
11. Push Pull Flip-Flop
12. Texas Instruments™ (TI) Low Power Flip-Flop
13. PowerPC™ 603 Flip-Flop
14. Conventional Flip-Flop
15. True Single Phase Clocking (TSPC) Flip-Flop
16. Low Power Flip-Flop Flip-flop designs 1 through 5, 7 and 13 are described by V. Stojanovic and V. Oklobdzija in Comparative Analysis of Master-Slave Latches and Flip-Flops for High-Performance and Low-Power Systems, 34 IEEE J. SOLID-STATE CIRCUITS, 536–548 (1999 April). Flip-flop designs 6, 8 and 9 are described by J. Wang, P. Yang and D. Sheng in Design of a 3V 300MHz Low-Power 8-b×8-b Pipelined Multiplier Using Pulse-Triggered TSPC Flip-Flops, 35 IEEE J. SOLID STATE CIRCUITS (2000 April). Flip-flop design 10 is disclosed in U.S. Pat. No. 6,060,927, entitled High Speed D Flip-Flop, of Lee et al. Flip-flop designs 11 and 16 are described by U. Ko and P. Balsara in High-Performance Energy-Efficient D Flip-Flop Circuits, 8 IEEE T+SC RANS. ON VLSI, 94–97 (2000 February). Flip-flop design 13 is disclosed in U.S. Pat. No. 5,789,956, entitled Low Power Flip-Flop, of Mahant-Shetti et al. Flip-flop designs 14 and 15 are described by S. Hsu and S. Lu in A Novel High-Performance Low-Power CMOS Master-Slave Flip-Flop, IEEE Intl. ASIC CONF., 340–343 (1999 September).

Power dissipation has become a major design concern in VLSI circuits for use in portable and battery-powered devices. Flip-flops are an integral component of digital circuits used for data storage. Hence, there is an important need for a flip-flop that not only has low operating power consumption but also has low leakage power consumption when the flip-flop is in a stand-by or sleep mode.

Moreover, as device geometries become smaller, the leakage power consumption increases in proportion to the operating power consumption.

Hence both operating power consumption and leakage power consumption must both be reduced to reduce the overall power consumption. Leakage power consumption is a major concern in portable electronic devices that may operate in a sleep mode for a considerable amount of time. Although many of the flip-flop designs referred to above have low operating power consumption, none of them is optimized to reduce overall power consumption.

Examples of the above-mentioned lack of optimization for overall power consumption in flip-flop designs 1–16 include:

Flip-flop designs 1–10 clock in the D-input every clock cycle (assuming single rising-edge transitions only), regardless of whether the state of the D-input is constant and regardless of whether or not the portion of the circuit that includes the flip-flop is in use. These characteristics lead to unnecessary transitions in the flip-flop and, hence, increased power consumption.

Flip-flop designs 11–16 can be operated in conjunction with clock-gating circuits that control the clock input into the flip-flop. However, operating any of these flip-flop designs in conjunction with a clock-gating circuit results in the potential drawbacks of increased delay times, setup times and hold times. These increased times are due to the dependence of the signal fed to the clock input of the flip-flop on the clock-gating control signal in addition to the normal clock signal. Operating flip-flop designs 11–16 in conjunction with a clock-gating circuit can prevent data from being clocked in on every clock cycle. Thus, operating the flip-flop with a clock gating circuit suffers from the shortcoming that a clock dependency persists as a result of controlling the gating of the data. Moreover, the clock-gating circuitry adds additional area and increases timing complexity.

In Estimation of Standby Leakage Power in CMOS Circuits Considering Accurate Modeling of Transistors Stacks, PROC. IEEE & ACM INTL. SYMP. ON LOW POWER ELECTRONICS & DESIGN, 239–244 (1998 August), Z. Chen, M. Johnson, L. Wei and K. Roy disclose applying a suitable input vector to circuitry to effect a substantial reduction in leakage power consumption of the circuitry. However, none of the above-mentioned flip-flop designs has the capability to apply such a vector.

Thus, what is needed is a flip-flop design that not only has low operational power consumption and low leakage power consumption, but that is additionally capable of setting its output to a predefined state that is independent of the data state at either or both of the clock input and the data input to reduce the leakage power consumption of circuitry connected to the output of the flip-flop. What is also needed is a flip-flop whose power consumption is low when its output is held in the predefined state. Finally, some types of circuitry may have low leakage power consumption when the output of the flip-flop is in one state, while other types of circuitry may have low leakage power consumption when the output of the flip-flop is in the other state. Thus, what is also needed is a flip-flop capable of being fabricated in embodiments having low leakage power consumption when the predetermined state corresponds to either output state.

SUMMARY OF THE INVENTION

The invention provides a flip-flop having a sleep mode in which power consumption is reduced. The flip-flop comprises a clock input, a data input, an input stage, an input gate, an output stage and an output clamp. The input gate is interposed between the data input and the input stage and operates in the sleep mode to isolate the input stage from the data input. The output stage is coupled to the input stage and includes an output having a first output state and a second output state. The output clamp operates in the sleep mode to set the output stage to a predetermined state regardless of the data states at the data input and the clock input. The predetermined state is the one of the output states in which the leakage power consumption of the flip-flop is less than in the other of the output states.

The predetermined state may alternatively be the one of the output states in which the leakage power consumption of circuitry connected to the output of the flip-flop is less than in the other of the output states.

As a further alternative, the predetermined state may be the one of the output states in which the leakage power consumption of a digital electronic circuit of which the flip-flop forms part is less than in the other of the output states.

The invention additionally provides a digital electronic circuit having a sleep mode in which power consumption is reduced. The electronic circuit comprises a data input and a flip-flop. The flip-flop includes a clock input, an input stage, an input gate, an output stage and an output clamp. The input gate is interposed between the data input and the input stage, and operates in the sleep mode to isolate the input stage from the data input. The output stage is coupled to the input stage and comprises an output having a first output state and a second output state. The output clamp operates in the sleep mode to set the output to a predetermined state regardless of the data states at the data input and the clock input. The predetermined state is the one of the output states in which the leakage power consumption of the digital electronic circuit is less than in the other of the output states.

Finally, the invention provides a method of establishing, in a digital electronic circuit, a sleep mode in which power consumption of the digital electronic circuit is reduced. The power consumption includes leakage power consumption. The digital electronic circuit includes a data input and a flip-flop coupled to the data input. The flip flop has a clock input and a data output. In the method, in the sleep mode, the data input is isolated from the flip flop and the data output is set to a predetermined state regardless of data states at the data input and the clock input. The predetermined state is a state of the data output in which the leakage power consumption is reduced.

Isolating the data input from the remainder of the flip-flop has the effect of not allowing any transitions to occur in the flip-flop while the flip-flop is in its sleep mode. This avoids the power consumption that such transitions would normally incur. Setting the output to the predetermined state sets the output to the output state that reduces the leakage power consumption of the digital electronic circuit composed of the flip-flop and the circuitry connected to the output of the flip-flop. Reducing the leakage power consumption of the digital electronic circuit involves reducing the leakage power consumption of either or both of the flip-flop and circuitry connected to the output of the flip-flop. Thus, the flip-flop, the digital electronic circuit and the method according to the invention provide a reduction in leakage power consumption not possible with the flip-flop designs described above.

DETAILED DESCRIPTION OF THE INVENTION

Figure 1:
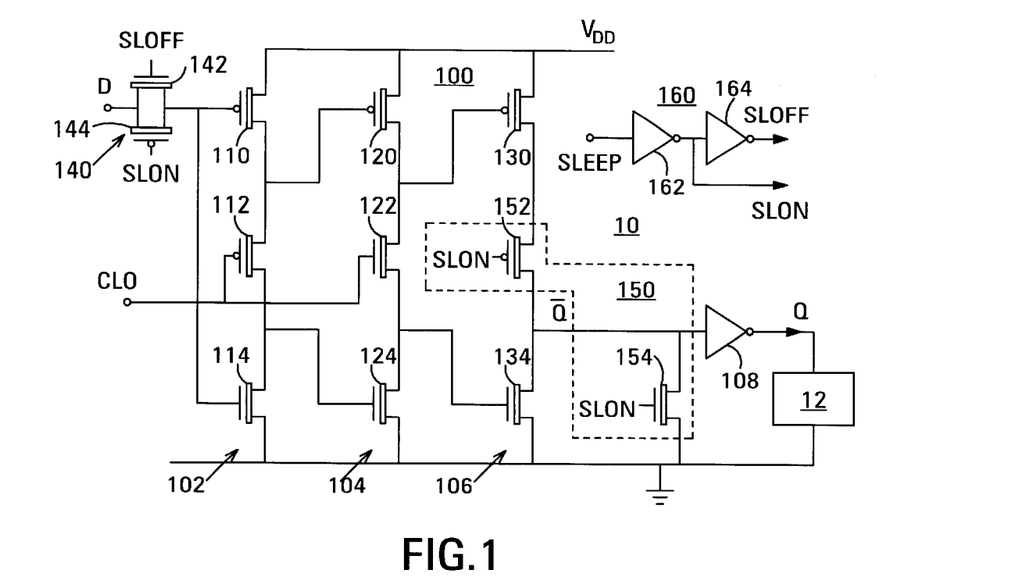
FIG. 1 is a schematic circuit diagram of a first embodiment of a flip-flop according to the invention.
Figure 2:
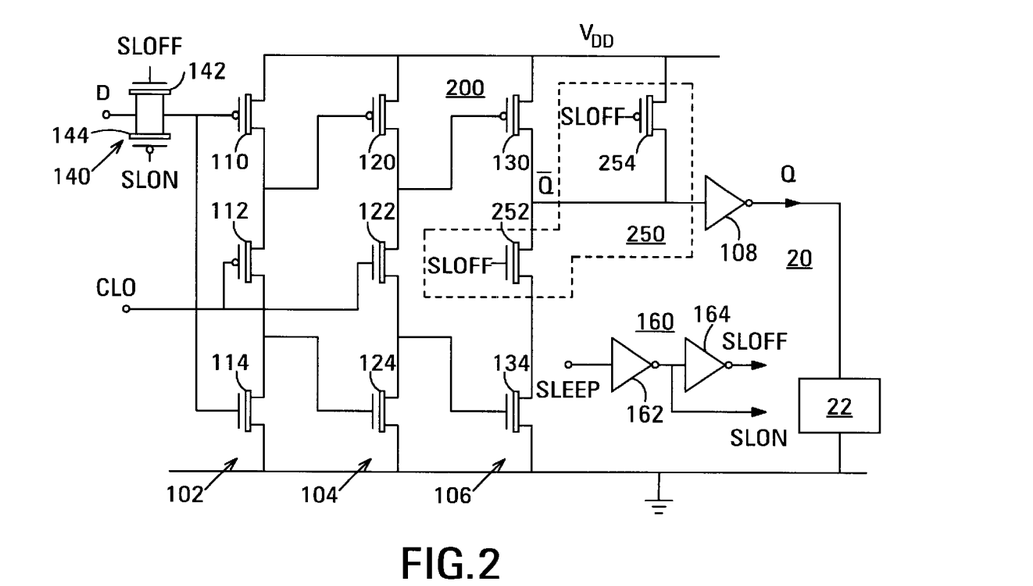
FIG. 2 is a schematic circuit diagram of a second embodiment of a flip-flop according to the invention.

FIGS. 1 and 2 show two embodiments of a low-power flip-flop according to the invention. Both embodiments of the flip-flop have a sleep mode set by the control signal SLEEP in which the power consumption of the flip-flop is reduced. FIGS. 1 and 2 also show are two embodiments of a digital electronic circuit according to the invention of which the flip-flop according to the invention forms part. Both embodiments of the digital electronic circuit have a sleep mode set by the control signal SLEEP in which the power consumption of the circuit is reduced.

FIG. 1 shows the flip-flop 100 according to the invention forming part of the digital electronic circuit 10 according to the invention. The digital electronic circuit is additionally composed of the circuitry 12 connected to the output Q of the flip-flop. The circuitry 12 is composed of one or more circuits, such as combinatorial logic circuits, adders, multipliers, etc., that are typically controlled by, or operate in response to, the state of the output Q of the flip-flop. The leakage power consumption of the circuitry 12 depends on the state of the output Q. In this example, the leakage power consumption of the circuitry 12 is less when the output Q is in its high state (designated as 1) than when the output Q is in its low state (designated as 0). Hence, the flip-flop 100 is configured so that, in the sleep mode, the output Q is set to the 1 state regardless of the states of the data and clock inputs D and CLO, respectively, to reduce the leakage power consumption of the digital electronic circuit 10.

FIG. 2 shows the flip-flop 200 according to the invention forming part of the digital electronic circuit 20 according to the invention. The digital electronic circuit is additionally composed of the circuitry 22 connected to the Q output of the flip-flop. The circuitry 22 is composed of one or more circuits that are typically controlled by, or operate in response to, the state of the output Q of the flip-flop. The leakage power consumption of the circuitry 22 depends on the state of the output Q. In this example, the leakage power consumption of the circuitry 22 is less when the output Q is in its 0 state than when the output Q is in its 1 state. Hence, the flip-flop 200 is configured so that, in its sleep mode, the output Q is set to its 0 state, regardless of the states of the data and clock inputs D and CLO, respectively, to reduce the leakage power consumption of the digital electronic circuit 20.

The embodiments 100 and 200 shown in FIGS. 1 and 2, respectively, of the flip-flop according to the invention are based on the flip-flop design no. 8 referred to above, i.e., the Eight Transistor D-type flip-flop. This flip-flop design was chosen as the basis for the flip-flop according to the invention because, when implemented using the 0.25 micron process of Agilent Technologies, Inc., the assignee of the invention disclosed herein, it has the lowest power of all of the flip-flop designs 1–16 when these designs are implemented using the same process. The Eight Transistor D-type flip-flop design additionally has the advantage of implementing a true single-phase-clocking strategy. This strategy provides a compact and simple clock distribution without any extra timing considerations such as clock skew caused by the need to distribute both the clock and its inverse to each flip-flop.

However, basing the flip-flop according to the invention on flip-flop design no. 8 is not critical to the invention. It will be apparent to the person of ordinary skill in the art that flip-flop designs 1–7 and 9–16, and other flip-flop designs not mentioned above, can form the basis of the flip-flop according to the invention.

The embodiment 100 of the flip-flop according to the invention will now be described with reference to FIG. 1. Elements of the basic eight-transistor D-type flip-flop on which the flip-flop 100 is based will be described first. The eight-transistor D-type flip-flop is composed of input stage 102, transfer stage 104, output stage 106 and inverting output driver 108. In the digital electronic circuit 10, circuitry 12 is connected to the output Q of the inverting output driver.

The input stage 102 is composed of PMOS transistors 110 and 112 and NMOS transistor 114 arranged in order and in series between the positive supply $V_{DD}$ and ground. In the conventional eight-transistor D-type flip-flop, the gates of transistors 110 and 114 are connected to the data input D. The gate of transistor 112 is connected to the clock input CLO.

The transfer stage 104 is composed of PMOS transistor 120 and NMOS transistors 122 and 124 arranged in order and in series between the positive supply $V_{DD}$ and ground. The gate of transistor 120 is connected to the node formed by the drain of transistor 110 and the source of transistor 112. The gate of transistor 122 is connected to the clock input CLO. The gate of transistor 124 is connected to the node formed by the drains of transistors 112 and 114.

In the conventional eight-transistor D-type flip-flop, the output stage 106 is composed of PMOS transistor 130 and NMOS transistor 134 arranged in order and in series between the positive supply $V_{DD}$ and ground. The gate of transistor 130 is connected to the node formed by the drains of transistors 120 and 122. The gate of transistor 134 is connected to the node formed by the source of transistor 122 and the drain of transistor 124. The node between the drains of the transistors 130 and 134 provides the output Q-bar, and is conventionally connected to the input of the inverting output driver 108. The output of the inverting output driver provides the output Q of the flip-flop 100.

The flip-flop 100 according to the invention additionally includes the input gate 140 and the output clamp 150 and optionally includes the control signal generator 160.

The input gate 140 is interposed between the data input D and the gates of transistors 110 and 114. The input gate is composed of NMOS transistor 142 and PMOS transistor 144 connected in parallel. The parallel combination is interposed between the data input and the gates of transistors 110 and 114. The gates of transistors 142 and 144 are connected to receive control signals SLOFF and SLON, respectively, generated by the control signal generator 160.

The output clamp 150 is composed of PMOS transistor 152 interposed between transistors 130 and 134 in the output stage 106 and NMOS transistor 154 connected in parallel with transistor 134. The gates of transistors 152 and 154 are connected to receive control signal SLON from the control signal generator 160. The node to which the drains of the transistors 154, 152 and 134 are connected provides the Q-bar output and the input of the inverting output driver 108 is connected to this node.

The control signal generator 160 is composed of inverters 162 and 164 connected in series. The input of inverter 162 receives the control signal SLEEP. The output of inverter 162 provides the control signal SLON and is connected to the input of the inverter 164 and the gates of transistors 144, 152 and 154. The output of inverter 164 provides the control signal SLOFF and is connected to the gate of transistor 142. The control signal generator is optional in the sense that more than one of the flip-flops 100 may be connected to receive the control signals SLON and SLOFF generated by a single control signal generator 160.

The control signal SLEEP is generated by a circuit (not shown) that determines when to place the flip-flop 100 in its sleep mode. Placing the flip-flop in its sleep mode places the electronic circuit 10 in its sleep mode. The flip-flop 100 can be placed in its sleep mode not only when the entire electronic device of which the digital electronic circuit 10 forms part is idle, but also when the digital electronic circuit 10 is idle, even though other parts of the electronic device may continue to operate. For example, digital electronic circuit 10 may form all or part of the data compression circuitry of a battery-operated electronic camera. The entire electronic camera typically enters a sleep mode if several minutes elapse without the user operating the camera. Moreover, even when the entire electronic camera is not in its sleep mode, the data compression circuitry can be placed in its sleep mode until a picture is taken and the data compression circuitry is required to operate to compress the resulting picture data.

Design tools for ASICs and other types of integrated circuits can include capabilities that enable circuits for generating one or more SLEEP control signals to be included in the overall circuit design. For example, circuits used to generate a control signal for clock gating circuits, described above, can be used to generate a suitable SLEEP control signal. Such circuits may alternatively be configured to generate suitably buffered control signals equivalent to the control signals SLON and SLOFF generated by the control signal generator 160. In this case, the control signal generator can be omitted.

Operation of the flip-flop 100 in its operating (non-sleep) mode will now be described. In the operating mode, the control signal SLEEP is in its 1 state. This control signal is preferably an active low signal. Consequently, the control signals SLON and SLOFF are in their 0 and 1 states, respectively, which set the input gate 140 to its ON state and the output clamp 150 to its OFF state. Specifically, the control signal SLOFF in its 1 state sets the transistor 142 to its ON state and the control signal SLON in its 0 state sets the transistor 144 to its ON state to set the input gate to its ON state, and the control signal SLON in its 0 state sets the transistor 152 to its ON state and sets the transistor 154 to its OFF state to set the output clamp to its OFF state. In its operating mode, the flip-flop 100 operates as a conventional single rising edge-triggered D-flip-flop, as will be described next.

Following conventional setup and hold time rules, the input data state at the data input D of the flip-flop 100 transfers through the input gate 140 to the input stage 102, specifically to the gates of transistors 110 and 114. The clock signal CLO in its 0 state holds transistor 112 in its ON state, which allows the input data state to propagate to the transfer stage 104, specifically to the gates of transistors 120 and 124. The input stage pulls these gates low if the data state is 1, or high if the data state is 0. The clock signal in its 0 state also holds transistor 122 in its OFF state, which prevents the data state input to the transfer stage from propagating to the output stage 106.

When the clock signal CLO transitions to its 1 state, transistor 112 turns OFF, which isolates transfer stage 104 from input stage 102. Additionally, transistor 122 turns ON, which allows the data state input to transfer stage 104 to pass to output stage 106. The data state input to the transfer stage turns either the transistor 134 or the transistor 130 of the output stage ON, depending on whether the input data state is a 1 or a 0, respectively.

Overall, the flip-flop 100 is inverting from the data input D to the output Q-bar at the drain of the transistor 134, so the state of the output Q-bar is the inverse of the state of the data input D. The inverting output driver 108 inverts the state of the output Q-bar to generate the output Q whose state follows the state of the data input D. The inverting output driver may also be configured to drive a greater number of loads than the output stage 106.

Operation of the flip-flop 100 in its sleep mode will now be described. In the sleep mode, the control signal SLEEP is in its 0 state. Consequently, the control signals SLON and SLOFF are in their 1 and 0 states, respectively, which set the input gate 140 to its OFF state and the output clamp 150 to its ON state. Specifically, the control signal SLOFF in its 0 state sets the transistor 142 to its OFF state and the control signal SLON on its 1 state sets the transistor 144 to its OFF state to set the input gate to its OFF state, and the control signal SLON in its 1 state sets the transistor 152 to its OFF state and the transistor 154 to its ON state to set the output clamp to its ON state.

In its sleep mode, the flip-flop 100 differs from the conventional eight-transistor D-type flip-flop in two respects, namely, the data input D is isolated from the remainder of the flip-flop and the output Q of the flip-flop is set to its 1 state, regardless of the states of the data and clock inputs D and CLO. Isolating the data input from the remainder of the flip-flop has the effect of not allowing any transitions to occur in the flip-flop while the flip-flop is in its sleep mode. This avoids the power consumption that such transitions would normally incur. Setting the Q output to its 1 state reduces the leakage power consumption of the digital electronic circuit 10, as described above. Reducing the leakage power consumption of the digital electronic circuit involves reducing the leakage power consumption of either or both of the flip-flop 100 and circuitry 12. The state of the flip-flop 100 that reduces the leakage power consumption of the digital electronic circuit 10 may not necessarily be the state of the flip-flop 100 in which the flip-flop 100 has the lowest leakage power consumption.

It should be noted that if the data previously latched into the flip-flop 100 were opposite in state to the state of the output Q-bar imposed by the output clamp 150, the OFF state of transistor 152, imposed by the control signal SLOFF, prevents contention between the two opposed states. Transistor 152 in its OFF state prevents transistor 130 from pulling the output Q-bar up in contention with transistor 154 pulling the output Q-bar down. On the other hand, if the data previously latched into the flip-flop had the same state as the output state imposed by the output clamp, the previously-latched data turns transistor 134 ON. In this case, transistor 134 operates together with transistor 154 to pull the output Q-bar down to its 0 state. This is an additional benefit of this design.

The second embodiment 200 of the flip-flop according to the invention will now be described with reference to FIG. 2. As noted above, flip-flop 200 is for use in applications in which the circuitry 22 connected to the output Q has less leakage power consumption when the output Q is in its 0 state than when the Q output is in its 1 state. Elements of the embodiment 200 that are the same as elements of the embodiment 100 are indicated by the same reference numerals and will not be described again here.

In the flip-flop 200, the output clamp 250 is composed of NMOS transistor 252 interposed between transistors 130 and 134 in the output stage 106 and PMOS transistor 254 connected in parallel with transistor 130. The gates of transistors 252 and 254 are connected to receive the control signal SLOFF from the control signal generator 160. The input of inverting output driver 108 is connected to the node to which the drains of transistors 130, 252 and 254 are also connected.

Operation of the flip-flop 200 in its non-sleep mode is the same as that of the flip-flop 100 described above and will therefore not be described again. In the sleep mode of the flip-flop 200, the control signal SLEEP is in its 0 state. Hence, the control signals SLON and SLOFF are in their 1 and 0 states, respectively, which set the input gate 140 to its OFF state as described above. The input gate in its OFF state isolates the input D from the remainder of the flip-flop. The control signal SLOFF in its 0 state sets the output clamp 250 to its ON state, i.e., the control signal SLOFF in its 0 state sets the transistor 252 to its OFF state and the transistor 254 to its ON state. This sets the Q output of the flip-flop 200 to its 0 state, regardless of the states of the data and clock inputs D and CLO. Isolating the data input from the remainder of the flip-flop has the effect of not allowing any transitions to occur in the flip-flop while the flip-flop is in its sleep mode. This avoids the power consumption that such transitions would normally incur. Setting the Q output to its 0 state reduces the leakage power consumption of the digital electronic circuit 20, as described above.

It should be noted that if the data previously latched into the flip-flop 200 were opposite in state to the state of the output Q-bar imposed by output clamp 250, the OFF state of transistor 252, imposed by the control signal SLOFF, prevents contention between the two opposed states. Transistor 252 in its OFF state prevents transistor 134 from pulling the output Q-bar down in contention with the transistor 254 pulling the output Q-bar up. On the other hand, if the data previously latched into the flip-flop had the same state as the state of the output Q-bar imposed by the output clamp, the previously-latched data turns transistor 130 ON. Thus, transistor 130 operates together with transistor 254 to pull the Q-bar output up to its 1 state. This is an additional benefit of this design.

Test samples of the embodiments 100 and 200 of the flip-flop according to the invention and of the above-listed conventional flip-flop designs were implemented using the Agilent Technologies 0.25-micron process. The results of tests performed on the samples are shown in Table 1. Specifically, table 1 shows the name and number of the flip-flop design, the transistor count, the total operational power consumption ($P_{total}$ in $\mu$W), the leakage power consumption ($P_{leak}$ in nW) with data inputs of 0 and 1, the average CLK to Q delay in ps and the power-delay product in aJ ($10^{-18}$ Joule). The conventional flip-flop designs do not have a sleep mode, so their leakage power consumption was measured by holding the data input D in the 0 or 1 state as indicated and disabling the clock signal. This method was also used to test the leakage power consumption of the embodiments 100 and 200 without putting the embodiments in their sleep mode. The results of these tests are indicated by (1) in Table 1. It should be noted that this method of testing resulted in abnormally high leakage power consumption in flip-flop designs 10 and 12.

The embodiments 100 and 200 were additionally tested with the control signal SLEEP in its 0 state (sleep mode ON) for half of the test cycle. The results of these tests are indicated by (2) in Table 1. This operational mode will be called the half-sleep mode, and emulates a typical operational mode of the flip-flop according to the invention in which the flip-flop alternates between its operational and sleep modes.

product is a useful metric for illustrating this aspect of a flip-flop's performance. The average of the power-delay products $PDP_{tot}$ of the embodiments 100 and 200 of the flip-flop according to the invention in the half-sleep mode is less than the power-delay product of any of the other flip-flop designs listed in Table 1, including the 8TDFF and the 9TDFF designs. This indicates that the flip-flop according to the invention is well suited for use in low-power, high-speed applications.

Figure 3A:
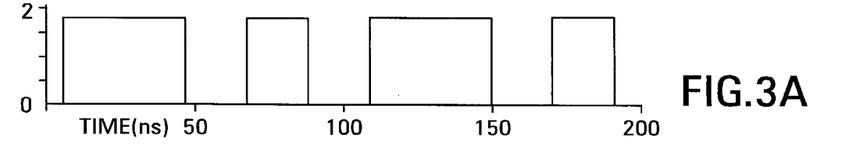
FIGS. 3A–3H are graphs showing the switching performance of the first embodiment of the flip-flop according to the invention in response to randomly-timed changes in the state of the data input D with the flip-flop in its non-sleep and sleep modes.
Figure 3B:
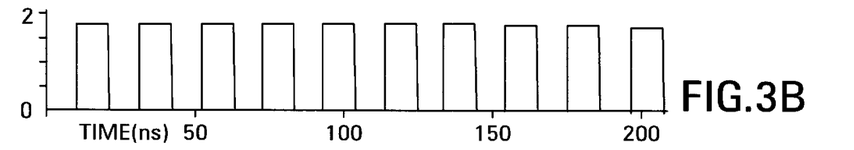
Figure 3C:
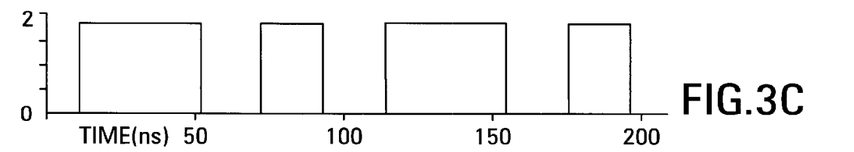
Figure 3D:
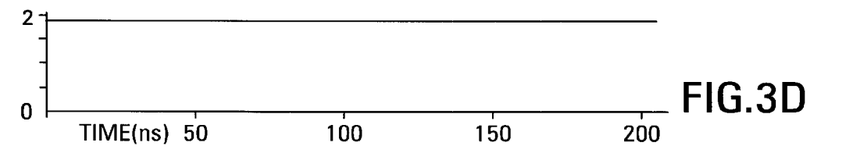

FIGS. 3A–3H show the switching performance of the embodiment 100 of the flip-flop according to the invention in response to randomly-timed changes in the state of the data input D. FIGS. 3A–3D show the normal (non-sleep) operation of the flip-flip. FIG. 3A shows the state of the data input D, FIG. 3B shows the state of the clock input CLO, FIG. 3C shows the state of the Q output and FIG. 3D shows the state of the control signal SLEEP. In FIG. 3D, the control

TABLE 1

| Number & Name | Trans. Count | $P_{total}$ ($\mu$W) | $P_{leak}$ (nW) DATA = 0 | DATA = 1 | CLK-Q Delay (ps) | $PDP_{tot}$ (aJ) |
| --- | --- | --- | --- | --- | --- | --- |
| 1. SenseAmp FF | 21 | 10.13 | 31.2 | 23.5 | 151 | 1534 |
| 2. StrongArm110 FF | 22 | 15.08 | 35.1 | 27.7 | 162 | 2449 |
| 3. Modified CCMOS | 24 | 9.40 | 9.9 | 10.5 | 184 | 1730 |
| 4. SDFF | 23 | 31.99 | 19.1 | 21.9 | 138 | 4424 |
| 5. HLFF | 20 | 14.03 | 2.0 | 3.8 | 108 | 1517 |
| 3. PTTFF | 18 | 12.53 | 18.8 | 18.6 | 166 | 2079 |
| 7. DSTC | 14 | 16.67 | 1.5 | 1.5 | 73 | 1210 |
| 8. 8TDFF | 10 | 2.78 | 0.2 | 4.8 | 146 | 406 |
| 9. 9TDFF | 11 | 2.69 | 4.2 | 3.9 | 132 | 354 |
| 10. HighSpeed DFF | 9 | 216.70 | 463800.0 | 409400.0 | 81 | 17606 |
| 11. PushPull DFF | 20 | 8.00 | 2.6 | 1.2 | 166 | 1327 |
| 12. TILPDFF | 18 | 223.60 | 180800.0 | 199500.0 | 93 | 20809 |
| 13. PPC603 | 22 | 6.72 | 1.2 | 2.8 | 213 | 1433 |
| 14. conventional FF | 20 | 5.22 | 0.8 | 0.8 | 184 | 960 |
| 15. TSPCFF | 26 | 7.64 | 2.1 | 1.9 | 241 | 1838 |
| 16. LowPower DFF | 20 | 6.23 | 1.1 | 2.7 | 235 | 1463 |
| Embodiment 100(1) | 18 | 3.27 | 0.7 | 7.6 | 203 | 664 |
| Embodiment 100(2) | 18 | 1.97 | 0.1 | 5.4 | 203 | 401 |
| Embodiment 200(1) | 18 | 2.99 | 2.8 | 5.1 | 180 | 537 |
| Embodiment 200(2) | 18 | 1.64 | 0.1 | 5.4 | 180 | 295 |

Table 1 shows that the operational power consumption of the embodiments 100 and 200 of the flip-flop according to the invention was lower than that of any of the other flip-flop designs listed in Table 1, except the 8TDFF and the 9TDFF designs.

In the half-sleep mode of the embodiments 100 and 200 of the flip-flop according to the invention, the leakage power consumption is not the lowest of the flip-flop designs listed in Table 1. However, in the sleep mode portion of the half-sleep mode of the flip-flop according to the invention, the output clamp sets the Q output to a predetermined state, regardless of the states of the data or clock inputs D and CLO, respectively. This enables the flip-flop according to the invention to feed a low leakage state input vector to the circuitry 12 or 22 connected to the Q output to reduce the leakage power consumption of the entire digital electronic circuit 10 or 20. None of the conventional flip-flop designs 1 through 16 has this capability.

In their half-sleep mode, the embodiments 100 and 200 of the flip-flop according to the invention have a lower total power $P_{total}$ than any of the other flip-flop designs listed in Table 1.

Figure 3E:
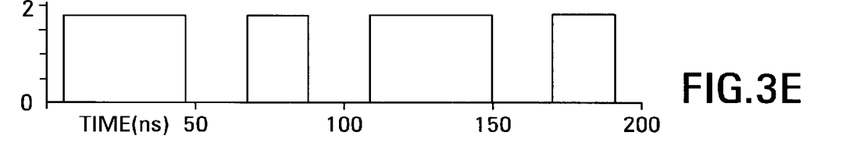
Figure 3F:
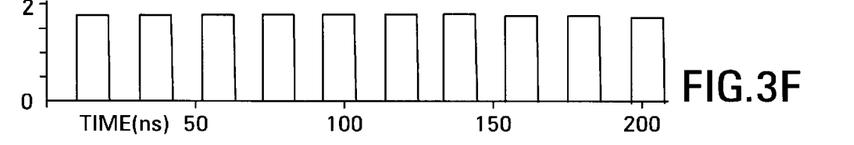
Figure 3G:
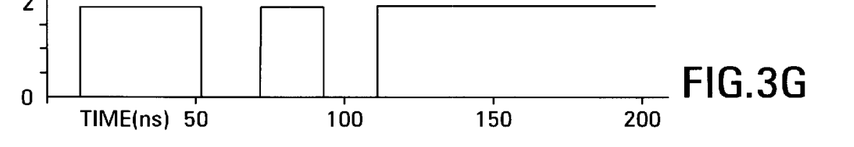
Figure 3H:
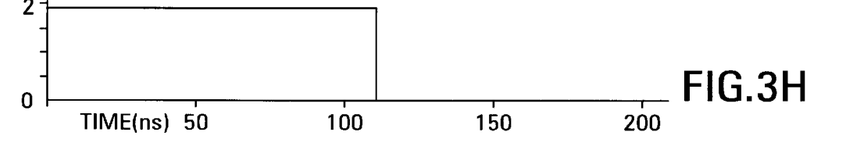

In low-power, high-performance applications, high speed is as important as achieving low-power. The power-delay signal SLEEP is in its non-sleep state. FIG. 3E–3H show the control signal SLEEP switching the flip-flop to its sleep mode. FIG. 3E shows the state of the data input D, FIG. 3F shows the state of the clock input CLO, FIG. 3G shows the state of the Q output and FIG. 3H shows the state of the control signal SLEEP. In FIG. 3H, the control signal SLEEP changes from the non-sleep state to the sleep state. It can be seen from FIG. 3G that the Q output immediately goes to its 1 state when the control signal SLEEP changes state, regardless of the states of the data and clock inputs D and CLO, respectively.

Figure 4A:
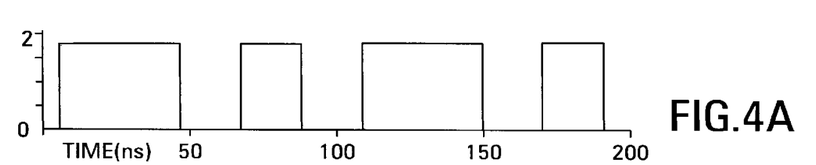
FIGS. 4A–4H are graphs showing the switching performance of the second embodiment of the flip-flop according to the invention in response to randomly-timed changes in the state of the data input D with the flip-flop in its non-sleep and sleep modes.
Figure 4B:
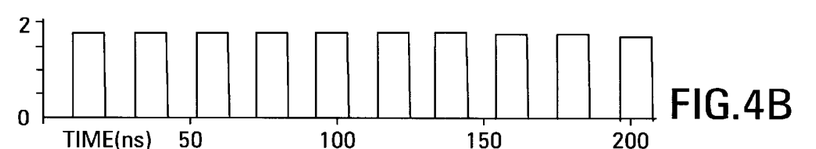
Figure 4C:
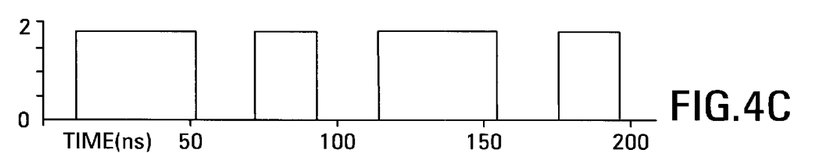
Figure 4D:
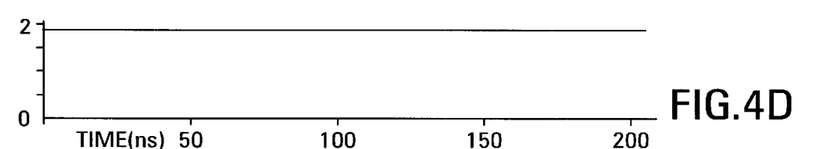
Figure 4E:
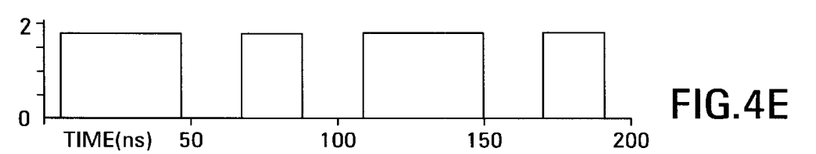
Figure 4F:
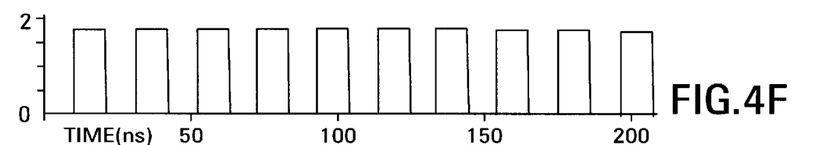
Figure 4G:
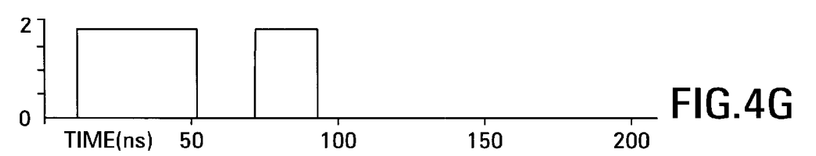
Figure 4H:
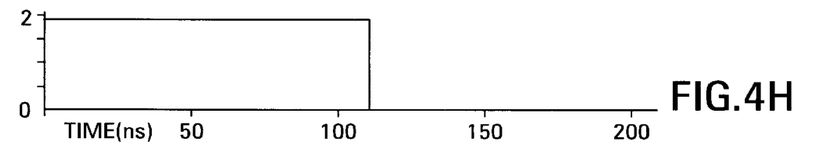

FIGS. 4A–4H correspond to FIGS. 3A–3H and show the switching performance of the embodiment 200 of the flip-flop according to the invention. In FIG. 4H, the control signal SLEEP changes from the non-sleep state to the sleep state. It can be seen from FIG. 4G that the Q output remains in its 0 state at the 0 to 1 transition of the clock signal after the state of the D input changes back to 1. Thus, in the sleep mode, the Q output is held in its 0 state regardless of the states of the data and clock inputs D and CLO, respectively.

Figure 5:
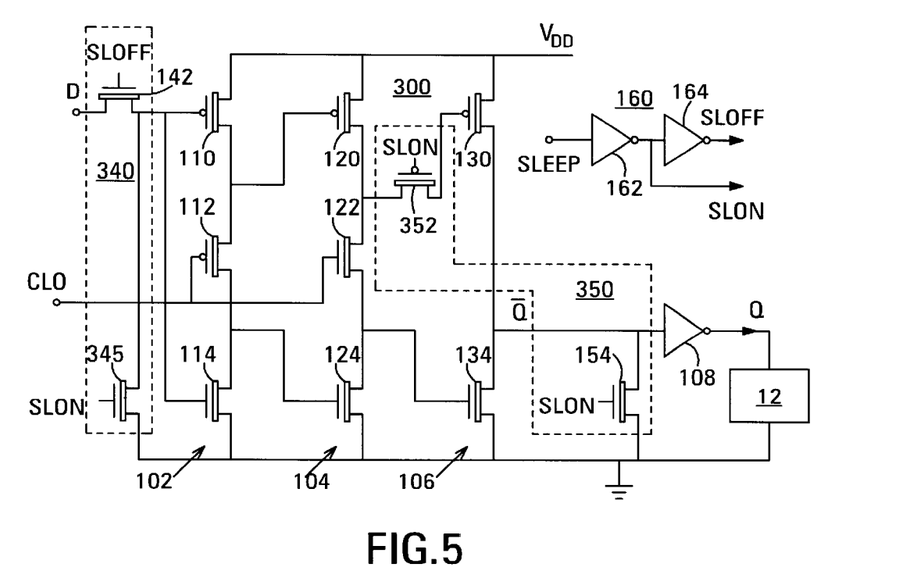
FIG. 5 is a schematic circuit diagram of an embodiment of the flip-flop according to the invention having alternative configurations of the input gate and output clamp.
Figure 6:
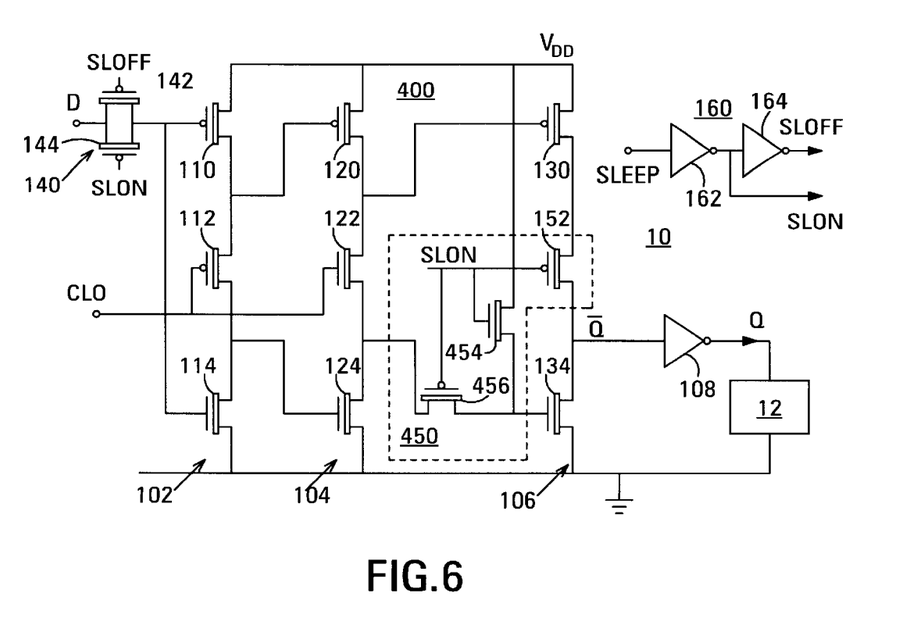
FIG. 6 is a schematic circuit diagram of an embodiment of the flip-flop according to the invention having another alternative configuration of the output clamp.

FIGS. 1 and 2 show preferred embodiments 100 and 200 of the flip-flop according to the invention. However, it will be apparent to one of ordinary skill in the art that circuit configurations different from the ones shown can be used for the input gate 140 and the output clamps 150 and 250. FIGS. 5 and 6 show some alternative configurations by way of example and not of limitation. The alternatives are shown as applied to the flip-flop 100. Corresponding alternatives can be applied to the flip-flop 200. The alternative embodiments of the input gate and the output clamp can be applied independently.

Elements of the embodiments shown in FIGS. 5 and 6 that are identical to those shown in FIG. 1 are indicated by the same reference numerals and will not be described again here.

FIG. 5 shows an alternative embodiment 340 of the input gate. In this, NMOS transistor 345 is connected between ground and the node between the drain of transistor 142 and the gates of transistors 110 and 114. The control signal SLON is connected to the gate of transistor 345. In the normal operating mode of the flip-flop 300, the control signal SLOFF in its 1 state sets transistor 142 to its ON state and control signal SLON in its 0 state sets transistor 345 to its OFF state. The input D is therefore connected to the input stage 102. In the sleep mode of the flip-flop 300, the control signal SLOFF in its 0 state sets transistor 142 to its OFF state and control signal SLON in its 1 state sets transistor 345 to its ON state. The input D is therefore isolated from the input stage 102.

FIG. 5 also shows an alternative embodiment 350 of the output clamp. In this, the drains of transistors 130 and 134 are directly connected, and the node thus formed provides the output Q-bar. The connection between the node formed by the drains of transistors 120 and 122 and the gate of transistor 130 is interrupted by PMOS transistor 352. The gate of transistor 352 is connected to receive the control signal SLON. In the normal operating mode of the flip-flop 300, the control signal SLON in its 0 state sets transistor 352 to its ON state and sets transistor 154 to its OFF state. The state of the output stage 106 therefore depends on the state of the transfer stage 104. In the sleep mode of the flip-flop 300, the control signal SLON in its 1 state sets transistor 352 to its OFF state and sets transistor 154 to its ON state. Transistor 154 pulls the output Q-bar to its 0 state, as described above. The OFF state of transistor 352 prevents the transistor 130 from pulling the output Q-bar up in conflict with transistor 154. Transistor 352 may alternatively interrupt the connection between the source of transistor 130 and the positive supply $V_{DD}$.

FIG. 6 also shows another alternative embodiment 450 of the output clamp. In this, the transistor 454 is connected between the positive supply $V_{DD}$ and the gate of transistor 134. In addition the connection between the node formed by the source of transistor 122 and the drain of transistor 124 and the gate of transistor 134 is interrupted by PMOS transistor 456. The gate of transistor 456 is connected to receive the control signal SLON. In the normal operating mode of the flip-flop 400, the control signal SLON in its 0 state sets transistor 152 to its ON state, as described above, sets transistor 454 to its OFF state and sets transistor 456 to its ON state. The state of the output stage 106 therefore depends on the state of the transfer stage 104. In the sleep mode of the flip-flop 400, the control signal SLON in its 1 state sets transistor 152 to its OFF state, as described above, and sets transistor 456 to its OFF state. This disconnects transistor 134 from the transfer stage 104 and from transistor 130 of the output stage. The control signal SLON in its 1 state additionally sets transistor 454 to its ON state. Transistor 454 in its ON state feeds a clamp signal to the gate of transistor 134. The clamp signal causes transistor 134 to pull the output Q-bar down to its 0 state. Transistor 152 may alternatively interrupt the connection between the source of transistor 130 and the positive SUPPLY $V_{DD}$.

The invention has been described above with reference to an example in which a single flip-flop according to the invention sets circuitry to a sleep mode in which the leakage power consumption of the circuitry is less than if the output of the flip-flop were in its other state. However, multiple flip-flops according to the invention, some of which have their output Q set to the 1 state in the sleep mode, as in the embodiment 100, others of which their output Q set to the 0 state in the sleep mode, as in the embodiment 200, may have their outputs connected to the circuitry. The flip-flops, when in their sleep mode, collectively generate a low leakage power vector that sets the circuitry to a sleep mode in which the leakage power consumption of the circuitry is substantially reduced, and is preferably minimized.

The invention is described above with reference to examples of flip-flops having specific logic states, transistor conduction polarities and supply polarities. However, these are not critical to the invention. The invention extends to flip-flops having various combinations of logic states, transistor conduction polarities and supply polarities different from those shown.

Although this disclosure describes illustrative embodiments of the invention in detail, it is to be understood that the invention is not limited to the precise embodiments described, and that various modifications may be practiced within the scope of the invention defined by the appended claims.

We claim:

1. A flip-flop having a sleep mode in which power consumption is reduced, the power consumption including leakage power consumption, the flip-flop comprising:

a clock input;

a data input;

an input stage;

an input gate interposed between the data input and the input stage and operating in the sleep mode to isolate the input stage from the data input;

an output stage coupled to the input stage, the output stage including an output having a first output state and a second output state;

output clamp means, operating in the sleep mode, for setting the output to a predetermined state regardless of data states at the data input and the clock input, the predetermined state being the one of the output states in which the leakage power consumption is less than in the other of the output states.

2. The flip-flop of claim 1, in which:

the output stage includes a first transistor of a first conductivity type in series with a second transistor of a second conductivity type;

the output clamp means includes:

a third transistor of the first conductivity type interposed between the first transistor and the second transistor, and a fourth transistor of the second conductivity type connected in parallel with the second transistor; and in the sleep mode, the third transistor is OFF and the fourth transistor is ON.

3. The flip-flop of claim 1, in which:

the input gate includes a first transistor of a first conductivity type connected in parallel with a second transistor of a second conductivity type, the transistors being interposed between the data input and the input stage; and the first and second transistors are turned OFF in the sleep mode.

4. The flip-flop of claim 1, in which the output clamp means is configured to feed a clamp signal into the output stage to set the output to the predetermined state.

5. The flip-flop of claim 1, in which the output clamp means is additionally for preventing contention between the predetermined state and the other of the output states when the other of the output states corresponds to the data state at the data input.

6. A digital electronic circuit comprising the flip-flop of claim 1, the digital electronic circuit having a power consumption, including leakage power consumption, the power consumption of the digital electronic circuit being reduced in the sleep mode, in which:
the digital electronic circuit comprises circuitry coupled to the output of the flip-flop; and
the predetermined state is the one of the output states in which the leakage power consumption of the digital electronic circuit is less than in the other of the output states.

7. The digital electronic circuit of claim 6, in which the predetermined state is the one of the output states in which the leakage power consumption of only the circuitry is less than in the other of the output states.

8. The digital electronic circuit of claim 6, in which the predetermined state is the one of the output states in which a sum of the leakage power consumption of the circuitry and the leakage power consumption of the flip-flop is less than in the other of the output states.

9. A digital electronic circuit having a sleep mode in which power consumption is reduced, the electronic circuit comprising a data input and a flip-flop having leakage power consumption, the flip-flop including:
a clock input;
an input stage;
an input gate interposed between the data input and the input stage, the input gate operating in the sleep mode to isolate the input stage from the data input;
an output stage coupled to the input stage, the output stage comprising an output having a first output state and a second output state; and
output clamp means, operating in the sleep mode, for setting the output to a predetermined state regardless of data states at the data input and the clock input, the predetermined state being the one of the output states in which the leakage power consumption of the digital electronic circuit is less than in the other.

10. The digital electronic circuit of claim 9, in which:
the digital electronic circuit additionally comprises circuitry coupled to the output, the circuitry having leakage power consumption; and
the predetermined state is the one of the output states in which only the leakage power consumption of the circuitry is less than in the other.

11. The digital electronic circuit of claim 9, in which:
the flip-flop has leakage power consumption; and
the predetermined state is the one of the output states in which only the leakage power consumption of the flip-flop is less than in the other.

12. The digital electronic circuit of claim 9, in which:
the output stage includes a first transistor of a first conductivity type in series with a second transistor of a second conductivity type;
the output clamp means includes:
a third transistor of the first conductivity type interposed between the first transistor and the second transistor, and
a fourth transistor of the second conductivity type connected in parallel with the second transistor; and
in the sleep mode, the third transistor is OFF and the fourth transistor is ON.

13. The digital electronic circuit of claim 9, in which:
the input gate includes a first transistor of a first conductivity type connected in parallel with a second transistor of a second conductivity type, the transistors being interposed between the data input and the input stage; and
the first and second transistors are turned OFF in the sleep mode.

14. The digital electronic circuit of claim 9, in which the output clamp means is configured to feed a clamp signal into the output stage to set the output to the predetermined state.

15. The digital electronic circuit of claim 9, in which the output clamp means is additionally for preventing contention between the predetermined state and the other of the output states when the other of the output states corresponds to the data state at the data input.

16. A method of establishing, in a digital electronic circuit, a sleep mode in which power consumption is reduced, the power consumption including leakage power consumption, the digital electronic circuit including a data input and a flip-flop coupled to the data input, the flip flop having a clock input and a data output, the method comprising, in the sleep mode:
isolating the data input from the flip flop; and
setting the data output to a predetermined state regardless of data states at the data input and the clock input, the predetermined state being a state of the data output in which the leakage power consumption is reduced.

17. The method of claim 16, in which:
the electronic circuit additionally includes circuitry connected to the data output, the circuitry having leakage power consumption; and
in setting the data output to a predetermined state, the predetermined state is a state in which the leakage power consumption only of the circuitry is reduced.

18. The method of claim 16, in which:
the flip-flop has leakage power consumption; and
in setting the data output to a predetermined state, the predetermined state is a state in which a sum of the leakage power consumption of the circuitry and the leakage power consumption of the flip-flop is reduced.

19. The method of claim 16, in which:
the flip-flop has leakage power consumption; and
in setting the data output to a predetermined state, the predetermined state is a state in which only the leakage power consumption of the flip-flop is reduced.

20. The method of claim 16, in which:
the digital electronic circuit includes a plurality of data inputs and a flip-flop coupled to each of the data inputs, each of the flip-flops having a clock input and a data output;
in isolating the data input, the each of the data inputs is isolated from the corresponding one of the flip-flops; and
in setting the data output, the data output of each of the flip-flops is set to a predetermined state regardless of the data states at the corresponding data input and the clock input to generate, from the predetermined states of the outputs of the flip-flops, a low leakage power vector that reduces the leakage power consumption.

* * * * *